US 6,549,442 B1

(12) United States Patent
Lu et al.

(10) Patent No.: US 6,549,442 B1
(45) Date of Patent: Apr. 15, 2003

(54) HARDWARE-ASSISTED FAST BANK-SWAP IN A CONTENT-ADDRESSABLE-MEMORY (CAM) PROCESSOR

(75) Inventors: Wei-Ping Lu, Saratoga, CA (US); Yaron Serfaty, Sunnyvale, CA (US); Fathy Yassa, Soquel, CA (US)

(73) Assignee: NeoMagic Corp., Santa Clara, CA (US)

( * ) Notice: Subject to any disclaimer, the term of this patent is extended or adjusted under 35 U.S.C. 154(b) by 0 days.

(21) Appl. No.: 10/064,554

(22) Filed: Jul. 25, 2002

(51) Int. Cl.[7] .............................................. G11C 15/00
(52) U.S. Cl. ...................... 365/49; 711/108; 365/230.03
(58) Field of Search ............................... 365/49, 189.07, 365/230.03; 710/3, 5; 711/5, 108

(56) References Cited

U.S. PATENT DOCUMENTS

| | | | |
|---|---|---|---|
| 4,758,982 A | 7/1988 | Price ............................ 364/900 |
| 5,034,919 A | 7/1991 | Sasai et al. .................... 365/49 |
| 5,195,050 A | 3/1993 | Hsu et al. ................ 364/728.01 |
| 5,317,708 A | 5/1994 | Edgar ............................ 395/425 |
| 5,696,930 A | 12/1997 | Garetz et al. ................. 395/435 |
| 5,777,608 A | * 7/1998 | Lippvski et al. ............. 345/519 |
| 5,857,089 A | 1/1999 | Goddard et al. ............. 395/563 |
| 5,860,085 A | 1/1999 | Stormon et al. ............. 711/108 |
| 5,872,950 A | 2/1999 | Levitan et al. ............... 395/393 |
| 6,094,716 A | 7/2000 | Witt .............................. 712/23 |
| 6,122,656 A | 9/2000 | Witt ............................ 709/100 |
| RE37,305 E | 7/2001 | Chang et al. ................ 711/207 |
| 6,266,763 B1 | 7/2001 | Witt et al. ...................... 712/36 |
| 6,285,378 B1 | 9/2001 | Duluk, Jr. .................... 345/441 |
| 6,327,639 B1 | 12/2001 | Asnaashari ................. 711/103 |
| 6,493,793 B1 * | 12/2002 | Pereira et al. ................. 365/49 |

* cited by examiner

Primary Examiner—Son Mai
(74) Attorney, Agent, or Firm—Stuart T. Auvinen

(57) ABSTRACT

An associative processor uses a content-addressable memory (CAM) array to operate on data. The array has several CAM banks that store data in CAM memory cells. Each CAM bank has a register file that stores compare data that drives compare bit lines to the CAM cells, which activate row-match signals for rows with matching data. Each CAM bank has a register file with copies of compare data for all CAM banks. An index value identifies which of the compare registers drives the bank's compare bit lines. When a bank-swap instruction is executed, the index values of two banks are swapped, causing the compare data to be used for a different CAM bank. The physical data in the CAM banks is not swapped, but the compare data used for comparisons is swapped. Since the register files contain all banks' compare data, the compare data does not have to be physically moved.

20 Claims, 13 Drawing Sheets

```
Loading bank1 with pixel_data 1;  // sequentially loading data
Loading bank2 with pixel_data 2;  // row-by-row through rd/wrt port.
Loading bank3 with pixel_data 3;  //

Initialize data/mask_reg_1 with algorithm_seq_1;  //
Initialize data/mask_reg_2 with algorithm_seq_2;  //
Initialize data/mask_reg_3 with algorithm_seq_3;  //

For loop 1 to 3
  Begin
      Begin
         Execute algorithm sequence 1 for bank1;  //
      End
      Begin
         Execute algorithm sequence 2 for bank2;  //
      End
      Begin
         Execute algorithm sequence 3 for bank3;  //
      End
    Swap (bank3), (bank2);   // Data of all banks will be operated on
    Swap (bank2), (bank1);   // with all three algorithms.
  End
```

FIG. 5A

Load pixel data set 1 into bank_1;
Load pixel data set 2 into bank_2;
Load pixel data set 3 into bank_3;

For loop 1 to N  // N steps of simple operations
Begin

Load compare_data_1 to data/mask_reg_1[0];
Load compare_write_data_1 to data/mask_reg_1[1];
Load compare_data_2 to data/mask_reg_2[0];
Load compare_write_data_2 to data/mask_reg_2[1];
Load compare_data_3 to data/mask_reg_3[0];
Load compare_write_data_3 to data/mask_reg_3[1];

For loop 1 to 3
    Begin
        Begin
          Compare operation on bank_1 with data/mask_reg_1[0];
          Modify write on bank_1 based on data/mask_reg_1[1]
          and the compare result;
        End
    Begin
          Compare operation on bank_2 with data/mask_reg_2[0];
          Modify write on bank_2 based on data/mask_reg_2[1]
          and the compare result;
    End
    Begin
        Compare operation on bank_3 with data/mask_reg_3[0];
        Modify write on bank_3 based on data/mask_reg_3[1]
        and the compare result;
    End SWAP (bank_3), (bank_2);
SWAP (bank_2), (bank_1);

End

FIG. 5B

HARDWARE-ASSISTED FAST BANK-SWAP IN A CONTENT-ADDRESSABLE-MEMORY (CAM) PROCESSOR

BACKGROUND OF INVENTION

This invention relates to content-addressable memories (CAM), and more particularly to data-move operations in a CAM.

Content-addressable memories (CAM) have been widely used for address translation caches known as translation-lookaside buffers (TLB's). CAM's are also being used to perform more general logic operations, especially when parallel operations are performed on a large data set. For example, image processing may manipulate a large array of pixels that make up an image. Operations may be performed on many pixels in parallel, such as reversing a background color for a special effect or removing a red color from foreground objects that represent human eyes (red-eye reduction).

Using a CAM array to perform such operations rather than sequential logic or a microprocessor allows many operations to be performed at the same time on different data items such as pixels in an image, or weather data readings on a map. Such CAM-based logical units are sometimes known as Associative Array Processors.

An associative processing architecture employs a CAM to perform parallel operations on a particular data set. For example, pixels representing a landscape image could be loaded into the CAM array. The data stored in the CAM can be searched for pixels having a numeric value representing blue colors, either a single color or a range of values representing a range of blue colors. The locations of these blue pixels is recorded and used to select them for following operations, such as changing the blue color to a darker blue, or even reversing the blue color to an orange color.

Data Movement in a CAM

When a complex series of operations needs to be performed on data, it may be more efficient to move the selected pixels to a new location in the CAM. In the new location, data can be repeatedly operated on without altering the non-selected data. For example, pixels in foreground objects in the image may be extracted and operated upon before being merged back into the image. The extracted pixels could be further searched for sub-objects, such as searching for eye shapes in face objects that were moved from the background image. The eye pixels could then be altered for red-eye reduction before the eye and face pixels are moved back into the full image data in another part of the CAM array.

Being able to move data blocks within the CAM array is thus useful for more efficient coding of associative-processing operations. The CAM array may have several columns or banks of data, each of which can be separately searched for matching data values. The programmer may load the original data into a first bank, perform a search for matching data values, then move these matching data values to a second bank. Data-manipulating operations can then be performed on the matching data in the second bank without altering the data in the first bank. Operating on such isolated data can be more efficient, especially when many operations and/or searches are performed in a complex processing sequence.

FIG. 1 shows a data-block move in a CAM array. The CAM array has three multi-bit columns or banks of CAM cells. Data can be accessed (written into or read from) first CAM bank 12 through read-write register 14 at the bottom of the array, while second CAM bank 22 is accessed through read-write register 24, and third CAM bank 32 is accessed through read-write register 34.

CAM memory cells each store a bit of data, often using a static latch such as a cross-coupled pair of inverters. Pass transistors can connect the CAM-cell latch to a pair of bit lines to allow reading and writing of the CAM cell much like a static random-access memory (SRAM) cell. Each row of each CAM bank can have many bits, such as 64 bits stored in 64 CAM cells for each row of CAM bank 12. Read-write register 14 can receive 64 data bits from read-write bus 16, and drive 64 pairs or bits lines to CAM bank 12. A row decoder (not shown) can select one or more of the rows in CAM bank 12 for reading or writing.

A row of data (a data word) can be moved from first CAM bank 12 to second CAM bank 22 using the bottom port. For example, a selected row of first CAM bank 12 is read, and the data stored in read-write register 14. Then the data from read-write register 14 is driven to read-write bus 16 and written to read-write register 24. Finally the data from read-write register 24 is driven onto the bit lines of second CAM bank 22 and written into a row of CAM cells selected by a row decoder (not shown) for second CAM bank 22.

This process can then be repeated for all data in first CAM bank 12 that is to be moved to second CAM bank 22. When many rows of data need to be moved, the move operation can be quite lengthy, reducing performance.

A CAM cell also has a compare port. For example, the data in each CAM cell can drive a gate or a drain of a compare transistor that connects to a compare bit line. Often a pair of compare bits lines are used with a pair of compare transistors in each CAM cell. The outputs of the compare transistors are connected to a row output line known as a row-match line or match line. Compare data from a compare register is driven to the compare bit lines, turning on one of the compare transistors and turning off the other compare transistor in each CAM cell, for all rows of CAM cells in the bank. The data in each CAM cell is basically exclusive OR'ed (or exclusive NOR'ed) with the compare data on the compare bit lines. When the compare data mis-matches the data stored in the CAM cell, the match line is driven to an un-match state. Any data in the row that does not match causes the row's match line to be driven inactive. When all data in a row matches, the match line is left in the match state.

Data is driven from compare register 10 at the top of first CAM bank 12 to the compare bit line in first CAM bank 12. Rows that store data that match the compare-line data have their match lines activated, while rows with at least one mis-matching CAM cell have their match lines driven inactive. The match lines for all rows can be stored in results register 26. One result bit can be stored for each of CAM banks 12, 22, 32 in results register 26.

Some CAM cells allow a write from the compare port as well as a compare-read. A row-write-enable signal can drive a transistor gate that connects an internal cell node to a ground. This cell node is known as a virtual-ground. When the virtual-ground node is driven to ground when a virtual-ground transistor is activated by the row-write-enable signal, the data from the compare bit lines is written to the data latch in the CAM cell.

Rather than move one data word at a time over read-write bus 16, a block of data can be moved using results register 26. A first data value is loaded from compare-input bus 18 to compare register 10, and compared to data values in first CAM bank 12. The match results are stored in results register 26. Results register 26 holds a "1" for a row when the data in compare register 10 matches the data word in the CAM cells for that row. The match result is fed back to the CAM array as the row-write-enable that drives the virtual ground node to ground, writing the compare bits lines back to the CAM cell latch.

These match values can then be used to write the compare data to the same rows in a different bank. The same compare data is written to compare register 20 for second CAM bank 22. Then the match bits from results register 26 are used as write-enables to enable writing from compare register 20 to selected rows of second CAM bank 22. The selected rows are the same rows that had matches from first CAM bank 12. Thus the data is effectively copied over from the matching rows of first CAM bank 12 to the same rows of second CAM bank 22. Compare register 10 can then be written with zeros and the stored match bits from results register 26 used to over-write the data words in first CAM bank 12 that were moved. This process can be repeated for all other possible data values of data in the block to be moved. When repeated data values are common, this second method may be faster than using read-write registers 14, 24.

Either method of moving a block of data from one CAM bank to another CAM bank is lengthy and relatively slow. The programmer has to create routines to read and write each row, or to load compare registers, compare and store match results, write to another bank, and clear the old data.

What is desired is a block-move operation for a CAM array. A bank-swap operation is desired that can move the data values of one CAM bank to another CAM bank. A fast swap operation is desirable that can swap CAM banks in a single step. CAM-bank-swapping hardware to facilitate such a bank-swap is desirable for an associative processor that uses a CAM to perform logic operations on data stored in a CAM.

BRIEF DESCRIPTION OF DRAWINGS

FIGS. 5A–B show pseudo-code using CAM bank swapping to perform three operations on three data sets.

DETAILED DESCRIPTION

The present invention relates to an improvement in content-addressable memory (CAM). The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
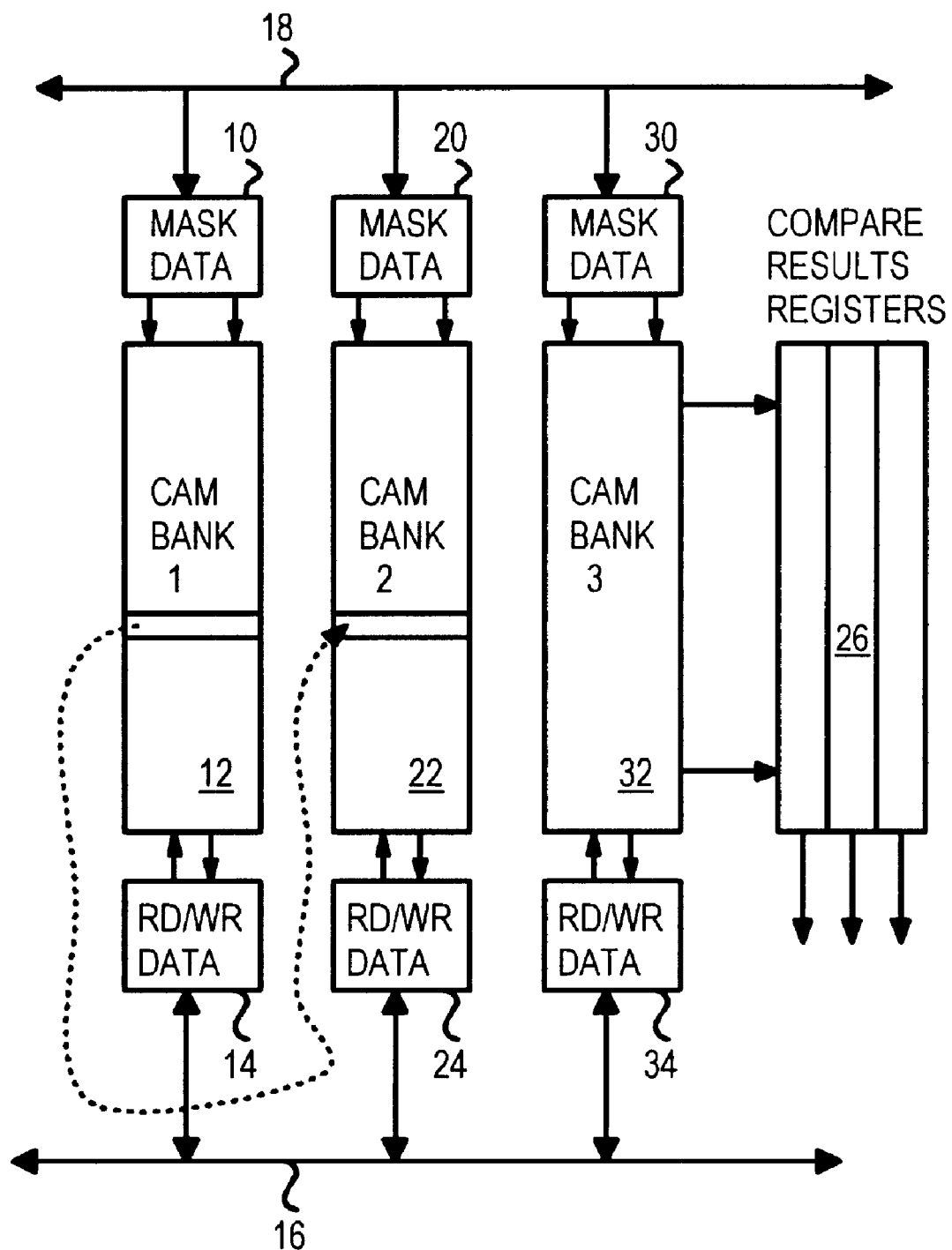
FIG. 1 shows a data-block move in a CAM array.
Figure 2:
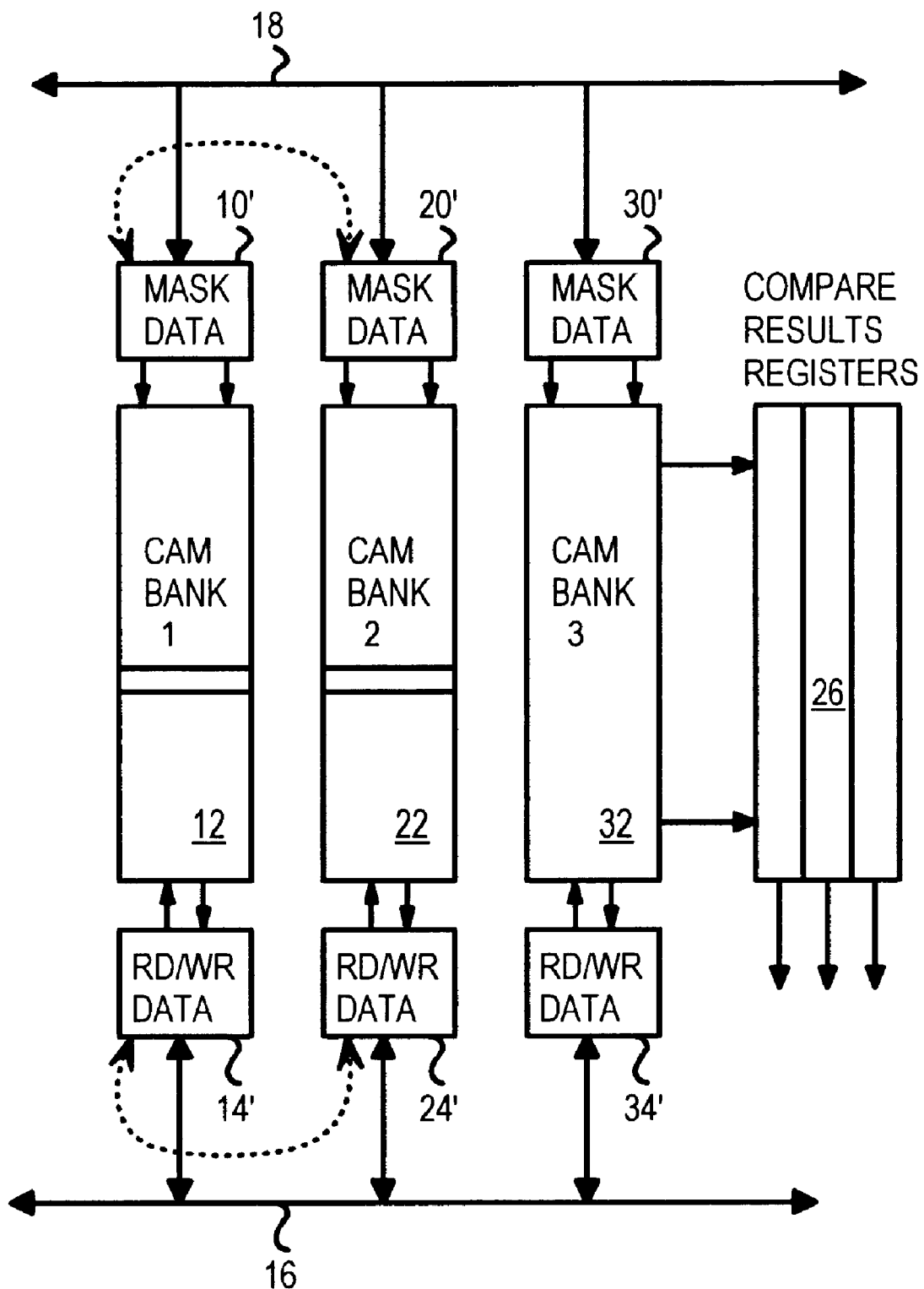
FIG. 2 highlights CAM bank swapping in a associative array processor.

FIG. 2 highlights CAM bank swapping in a associative array processor. Rather than physically move data from one CAM bank to another, the indexes or addresses of the compare and read-write registers to the banks are swapped. Additional hardware shown later can be used to facilitate such index swapping.

Each CAM bank is accessed by the programmer specifying a bank identifier or index of a register or port to the CAM bank. For example, compare register 10' can be written with a 3-bit index value equal to 001, while compare register 20' is accessed with an index of 010, and compare register 30' being accessed by an index of 011. Read-write register 14' responds to index 101, read-write register 24' to index 110, and read-write register 34' to index 111.

When the programmer executes a CAM bank-swap operation, the registers' index values are swapped between two or more CAM banks. For example, when CAM banks 12 and 22 are swapped, compare-registers 10', 20' swap indexes so that compare register 10' for first CAM bank 12 now responds to index 010, which register 20' previously responded to. Likewise, compare register 20' for second CAM bank 22 now responds to index 001, which register 10' previously responded to.

After execution of the swap operation, when the programmer accesses the data physically stored in first CAM bank 12, it appears to be in second CAM bank 22 since first bank 12 now is accessed using index values originally used by compare register 20' for second CAM bank 22.

The compare data in compare register 10' also appears to have moved over to compare register 20', for embodiments that swap compare-register data as well as the indexes the compare registers respond to. Likewise, the data stored in read-write register 14' may appear to have moved to read-write register 24' in some embodiments. The index used to access read-write register 14' is swapped with the index to access read-write register 24'.

Swapping may also occur between second CAM bank 22 and third CAM bank 32. Indexes to compare registers 20', 30' and read-write registers 24', 34' are swapped. Results data in results register 26 may or may not be swapped, depending on the embodiment or options chosen by the designer and programmer.

Compare registers can include both compare bits and mask bits. When a mask bit is zero, the compare data for that bit is disabled and does not affect the match results. Both compare bit lines for that bit's position can be driven to the same state, such as high, to mask the compare. The match result is true for this bit regardless of the data stored in the CAM cell for this bit-column. When a mask bit is one, the compare bit is used for the comparison, and the compare bits lines are driven by the compare bit value.

Figure 3:
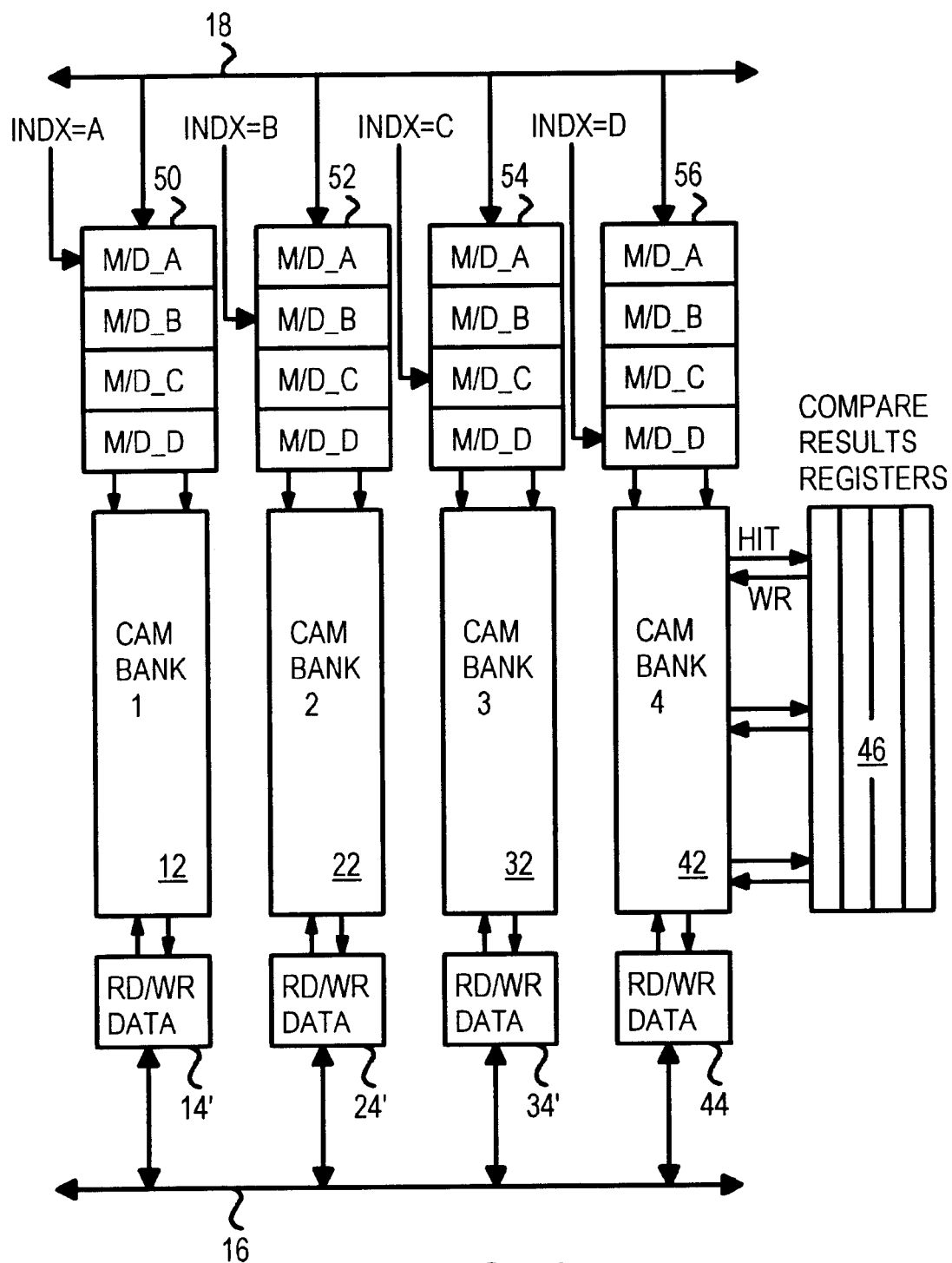
FIG. 3 is a more detailed diagram showing register files for quickly swapping compare registers to execute a CAM bank swap.

FIG. 3 is a more detailed diagram showing register files for quickly swapping compare registers to execute a CAM bank swap. Rather than have a single compare register for each CAM bank, a register file is provided for each bank. This allows for rapid swapping of CAM banks. Compare register file 50 contains four compare registers, one for each of the four compare-register index values that access four CAM banks 12, 22, 32, 42 in this embodiment.

Compare register file 50 normally responds to index value A, selecting the compare mask/data value M/D_A for index A. Three other compare data registers in register file 50 shadow the values M/D_B for index B, M/D_C for index C, and M/D_D for index D. The mask and data values M/D_A are used to drive the compare bit lines to first CAM bank 12 when CAM bank 12 responds to index A.

Compare register file 52 for second CAM bank 22 normally responds to index value B, selecting the compare mask/data value M/D_B for index B. The three other compare data registers in register file 52 shadow the values M/D_A for index A, M/D_C for index C, and M/D_D for index D. The mask and data values M/D_B are used to drive the compare bit lines to second CAM bank 22 when CAM bank 12 responds to index B.

Similarly, compare register file 54 for third CAM bank 32 responds to index C after a reset, selecting the compare mask/data value M/D_C for index C. Compare register file 56 for fourth CAM bank 42 responds to index D after a reset, selecting the compare mask/data value M/D_D for index D. Each compare register file 50, 52, 54, 56 stores three extra compare mask/data values that are being used by the other CAM banks.

When a compare register is loaded from compare-input bus 18 with either mask or data bits, all four register files 50, 52, 54, 56 are also loaded. For example, when compare data is written to index A, compare register file 50 writes the data as M/D_A, compare register file 52 writes the data as M/D_A, and compare register files 54, 56 also write the data as M/D_A. Thus compare data is loaded in parallel to all four compare register files 50, 52, 54, 56, even though the compare data being written in is used by one of the CAM banks.

The results of the compare operations are stored in results register 46. The match lines from each CAM bank are output and stored in results register 46. One result bit can be stored for each row of each of the four CAM banks. This result bit can be fed back to the same row of the same CAM bank, or to the same row of a different CAM bank when muxing is provided. The result could also be processed through logic. For example, the result could be negated through a separate control derived from the decoded instruction, such that the write occurs only to CAM cells of non-matched rows rather than matching rows. The fed-back result bit is a row-write-enable that connects a node between the two compare transistors to a ground to perform writing from the compare register to the CAM cells that had matches.

Read-write registers 14', 24', 34', 44 may also be register files, or may be simple registers or even pass-though latches or buffers. In one embodiment, registers are not used at all for the bottom port. Instead, data from read-write bus 16 is buffered to the bit lines when writing is enabled from the bottom port.

When a bank-swap is performed, the indexes that the swapped banks respond to are swapped. For example, when second and third banks 22, 32 are swapped, compare register file 52 for second bank 22 starts responding to index C rather than index B, while compare register file 54 for third bank 32 starts responding to index B rather than index C.

Since the compare data is already stored in all register files, the compare data does not have to be physically moved. Instead the compare register files for the swapped banks respond to a different index value, and select a different compare value for the new index when driving compare lines to the CAM banks.

The programmer can perform a bank swap by using a special CAM instruction, such as SWAP bank1, bank2. Other parameters can be included, such as specifying whether the compare data itself is swapped or only the indexes for future writes to the compare data registers.

Figure 4A:
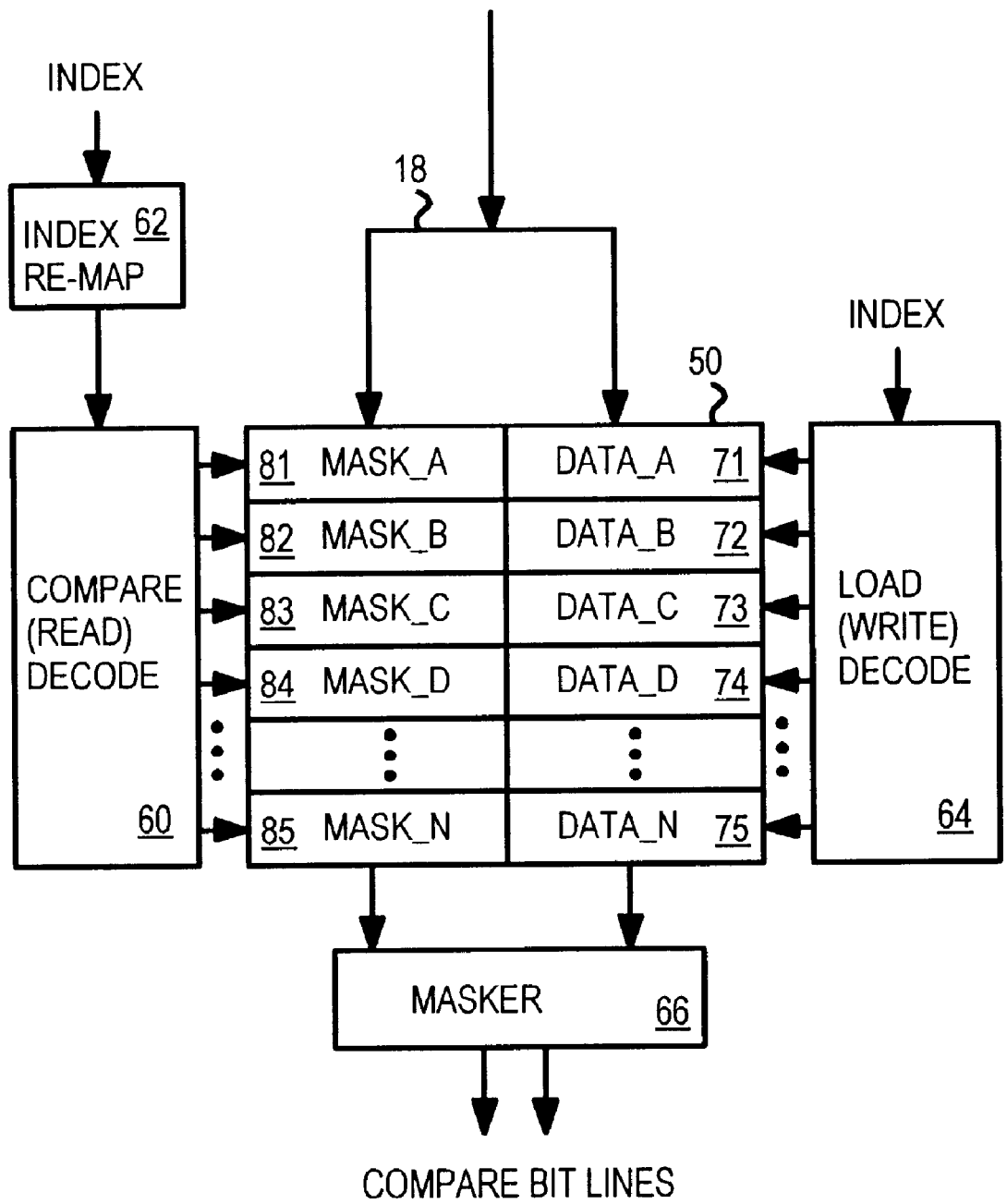
FIG. 4A shows a compare register file.

FIG. 4A shows a compare register file. Mask data from compare-input bus 18 is written to one of mask registers 81–85 that is selected by write decoder 64. Compare data from compare-input bus 18 is written to one of data registers 71–75 that is selected by write decoder 64. Another bit of the index or a mode bit from another register can determine when mask registers 81–85 rather than data registers 71–75 are to be written. Mask and compare data for indexes A–N are stored. Index A can be 000, index B can be 001, etc, or other encodings can be used. Write decoder 64 decodes the index identifying the register to be loaded or written with the data on bus 18.

The number of mask and data registers is equal to the number N of CAM banks. A $2^N$-bit index can be used to select one of the N registers, or a larger index can be used, or a subset of a larger address. Other embodiments may have different numbers of register; not necessarily equal to the number of CAM banks.

Re-mapper 62 contains re-mapping logic that is altered when a swap operation occurs. An address re-map table may be used to implement re-mapper 62, or logic that is driven by a swap re-map register, or logic in a finite state machine may be used. Re-mapper 62 receives the index from a control finite state machine. The finite state machine assigns and manages the designation of indexes when a swap operation occurs. A global re-mapper table could also be part of the finite state machine that controls the index generation for all the banks. Re-mapper 62 outputs the index to be used by that CAM bank when performing compare operations. For example, after reset the first CAM bank responds to index 01 but after a swap it responds to index 10. Re-mapper 62 can compare the index from a compare instruction to 01 before the swap, but to 10 after the swap.

When the index does not match, no compare operation is performed by this CAM bank. When the index matches, the re-mapped index is sent to read decoder 60, which then decodes the re-mapped index to select one of mask registers 81–85 and one of data registers 71–75 for output to masker 66. Masker 66 then combines the mask and data values for each bit and drives the compare bit lines. For example, when a mask bit is high, both of the compare bit lines for that bit-position can be driven low to enable a match regardless of the data in the CAM cell at that bit-position. When a mask bit is low, the data bit is buffered and inverted, with one of the pair of compare bit lines driven with the non-inverted data bit and the other driven with the inverted data bit.

In this embodiment, the index is not re-mapped for writes, but the index is only remapped for reads to the compare lines. Thus the index from a load instruction is passes unchanged to write decoder 64, which selects one of data registers 71–75 or one of mask registers 81–85 for writing. For example, when the index in the load-mask instruction is C, then mask register 83 is written with the data on compare-input bus 18. All register files for all CAM banks can be loaded with the same data in parallel at the same time, since the data is shadowed to all CAM banks to allow for a fast bank-swap.

Since the read index is remapped but the write index is not, after a bank-swap occurs, different mask/data registers are driven to the compare bit lines for a pair of swapped CAM banks. When a subsequent load operation writes new compare data to the data or mask registers of the swapped banks, the data is written to the index from the instruction. This index now is used for compares by the swapped bank, rather than the physical bank referred to by the index. Thus the programmer must use the new index for the bank, not the original index. The programmer can use this programming model to pipeline a sequence of operations.

Figure 4B:
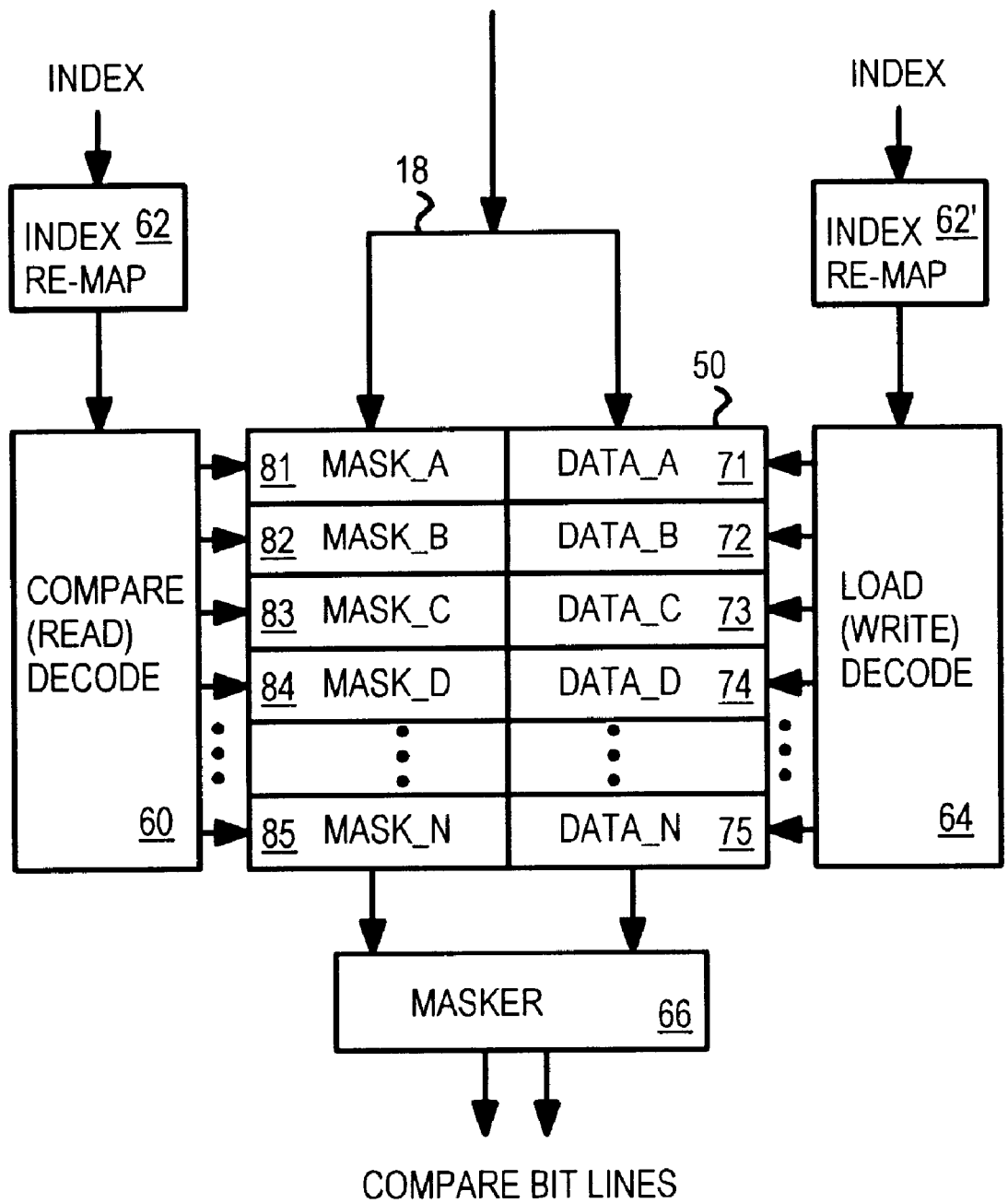
FIG. 4B shows a compare register file that re-maps both read and write indexes after a CAM bank swap.

FIG. 4B shows a compare register file that re-maps both read and write indexes after a CAM bank swap. The register file is similar to that shown and described for FIG. 4A, except that write re-mapper 62' has been added. Write re-mapper 62' re-maps the write index after a bank swap has occurred. This allows the programmer to continue to use the original index for a bank of data after a swap occurs. For example, when banks A, B are swapped, first register file 50 drives the compare bit lines to the first CAM bank when the read index to re-mapper 62 is B. The compare bit lines to the first CAM bank are driven from B registers 72, 82. When a load occurs to write index B, write re-mapper 62' causes an index of value A to be sent to write decoder 64, and A registers 71, 81 are loaded. A load to write-index A is remapped to index B, loading B registers 72, 82. Thus the programmer needs to use write index A to load the B registers driving the compare bit lines for the first CAM bank after a swap has occurred. The programmer must keep track of the swaps performed.

Thus in this embodiment the write index always refers to the physical CAM bank regardless of any previous swap operations executed. The programmer may find it easier to load compare registers since the write index refers to the physical CAM bank in this embodiment.

Write re-mapper 62' responds to all write index values, since one of the data or mask registers is loaded in each bank's register files to shadow the compare data. However, read re-mapper 62 responds only to the read index that matches the currently-mapped index for that CAM bank. Other read indexes are ignored. Compares can be performed on several banks in parallel when separate match lines and result registers are used for each bank. The finite-state-machine keeps track of the assignments of indexes.

FIGS. 5A–B shows pseudo-code using CAM bank swapping to perform three operations on three data sets. FIG. 5A shows simplified pseudo-code while FIG. 5B shows more detailed pseudo-code. Three CAM banks are initially loaded with pixel data sets 1, 2, 3. This loading is performed by writes through the read-write registers on the bottom of the CAM array. Since each row must be written separately, the initial pixel load is a slow process.

A compare value "algorithm_seq1" is written into the compare register (data/mask) for the first CAM bank, "data/mask_reg_1". Other values "algorithm_seq2" and "algorithm_seq3" are written into the compare registers for the second and third CAM banks, "data/mask_reg_2" and "data/mask_reg_3". These compare values may be specific pixel values that will be searched for and operated upon.

A loop is executed three times so that all data sets are operated upon by all three algorithm sequences. A first sequence of operations is executed on the data set in the first CAM bank. This first sequence includes performing a compare using the compare data in the first compare register, data/mask_reg_1. Once matching pixels are found in the first CAM bank, other operations may be performed on these matching pixels, such as over-writing the matches with updated pixel values. The locations of the matching rows are stored in the result register, allowing several operations to be performed on these matching rows.

A second sequence of operations is executed on the data set in the second CAM bank. This second sequence includes performing a compare using the compare data in the second compare register, data/mask_reg_2. Once matching pixels are found in the second CAM bank, other operations can adjust these matching pixels, such as by over-writing the matches with updated pixel values.

A third sequence of operations is also performed. The third sequence includes a compare of the third compare register, data/mask_reg_3, to all rows of data in the third CAM bank. Matching rows can be further operated upon.

Once the pixels in bank 1 have been operated upon by sequence 1, and the pixels in bank 2 have been operated upon by sequence 2, and the pixels in bank 3 have been operated upon by sequence 3, banks are swapped so that other banks can have other sequences. The first swap instruction swaps the second and third banks, so that the third bank responds to the second index value 2, and the second bank responds to index value 3. The second swap instruction swaps the first and second banks (the first and original third bank) so that the original third bank responds to index 2, the original first bank responds to index 3, and the original second bank responds to index 1. Note that the combination of two swap instructions emulates a backwards rotate.

After the swaps, the loop is again executed. In the second pass, physical bank 1 (data set 1) responds to index 3, is compared to the third compare value (data/mask_reg_3) and has sequence 3 operated upon it. Physical bank 2 (data set 2) responds to index 1, is compared to the first compare value (data/mask_reg_1) and has sequence 1 operated upon it. Also, physical bank 3 (data set 3) responds to index 2, is compared to the second compare value (data/mask_reg_22) and has sequence 2 operated upon it.

After the second pass, the first set of data in physical bank 1 has been operated upon by both the first and third sequences, having been compared to the first and third compare values from data/mask_reg_1 and data/mask_reg_3. Likewise, the second and third data sets have been operated upon by two of the three sequences.

The two swap instructions are again executed at the end of the second pass through the loop, rotating the indexes one more position to the left. So in the third pass of the loop, the data in the first CAM bank (pixel_data_1) responds to index 2 and thus is compared to the second compare value (data/mask_reg_2), and is operated upon by the second sequence. The data in the second CAM bank now responds to index 3, is compared to data/mask_reg_3, and is operated upon by the third sequence. The data in the third CAM bank now responds to index 1, is compared to data/mask_reg_1, and is operated upon by the first sequence.

At the end of the third pass through the loop, all three data sets have been operated upon by all three sequences. Each sequence can operate upon a different grouped of pixel values, since each sequence begins with a CAM-based compare to a different compare register value. The routine allows the large data sets to be loaded only once, and the compare registers are also loaded only once. Neither the data values in the CAM rows nor the compare data in the register files are physically moved, yet all combinations of compare data and CAM data are executed.

Figure 6A:
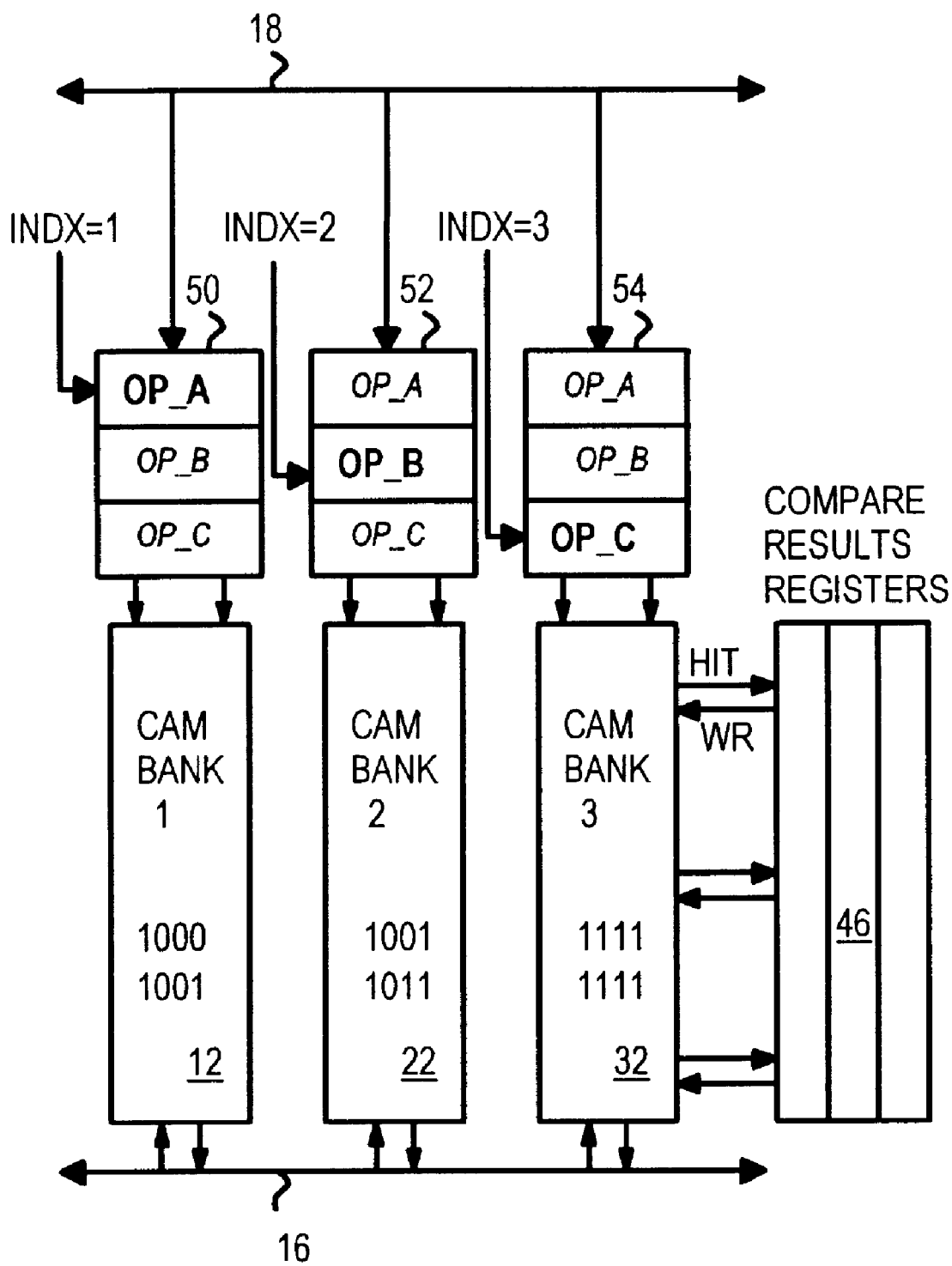
FIGS. 6A–C illustrate execution of the swap loop of FIG. 5A.
Figure 6B:
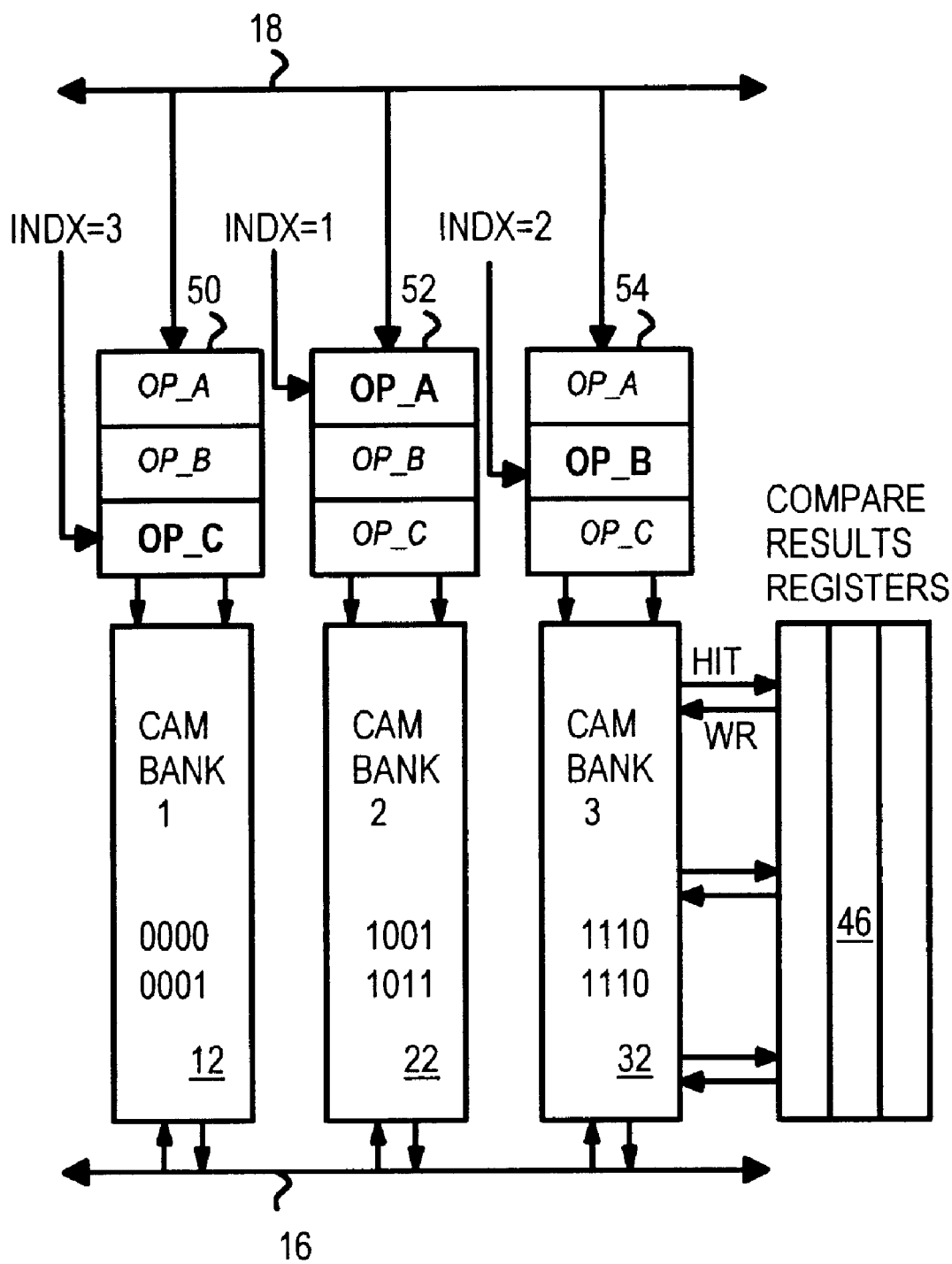
Figure 6C:
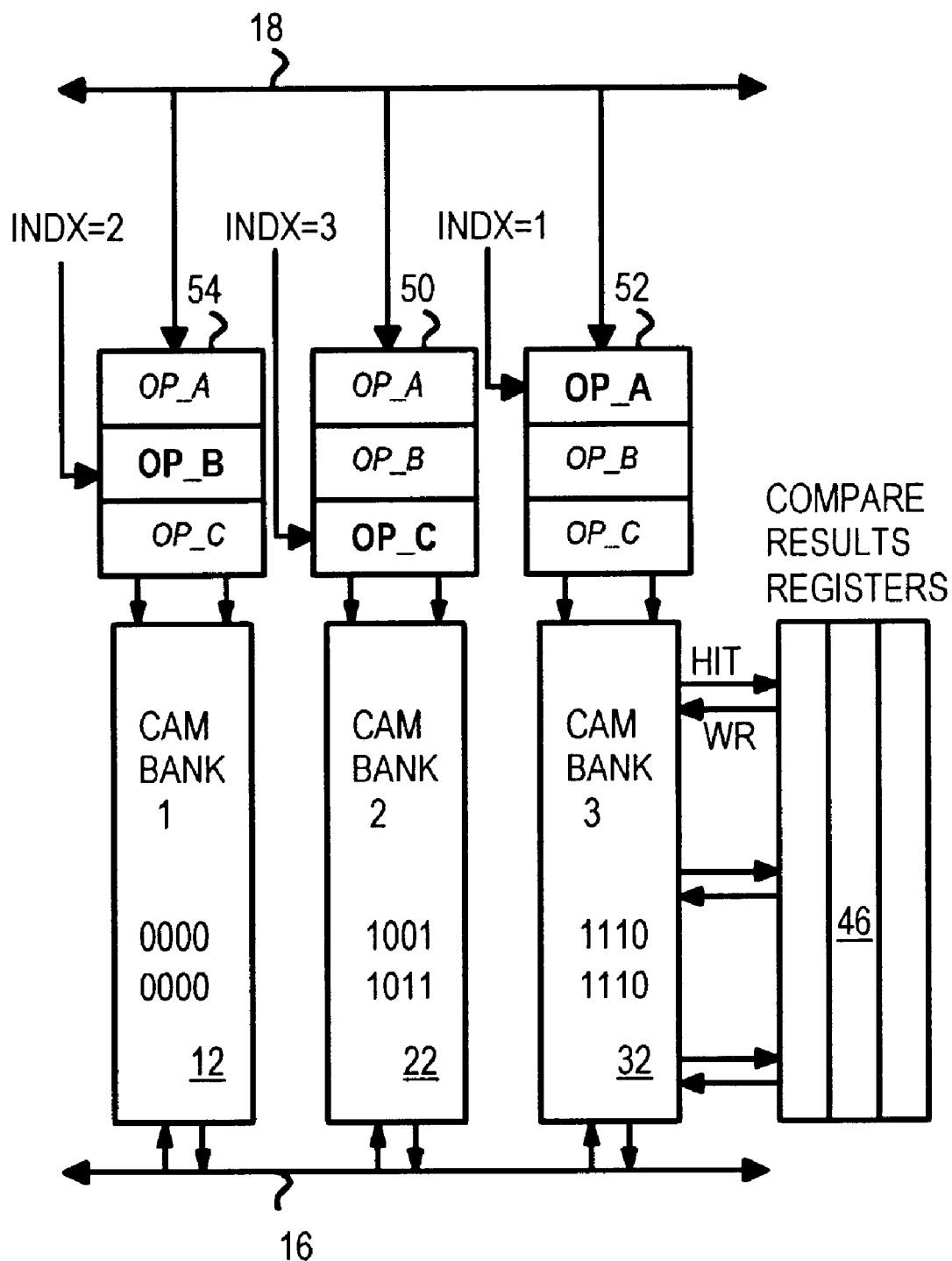

FIGS. 6A–C illustrate execution of the swap loop of FIG. 5A. First CAM bank 12 is loaded with first data set pixel_data_1, second CAM bank 22 is loaded with second data set pixel_data_2, and third CAM bank 32 is loaded with third data set pixel_data_3. Each data set could be a different image, of different foreground objects extracted from an image, etc.

The first compare data from algorithm_seq1 is loaded as operand A (op_A) into all three register files 50, 52, 54 using a load with index=1. The second and third compare data words are also loaded as operands B, C (op_B, op_C) into all three register files 50, 52, 54 using a load with index=2, and another load with index=3.

During execution of the first pass of the loop of FIG. 5A, compare operations are performed to located rows of pixel data in CAM banks 12, 22, 32 that match the compare data from register files 50, 52, 54. The match results of these compares are stored in results register 46. These match results can then be used as write-enables to write data to just the matching rows from the compare registers. A pair of compare data registers can be used for most of the operations: one for compare and one for write-back.

First register file 50 responds to index 1, and drives the compare bit lines of first CAM bank 12 with operand A. Second register file 52 responds to index 2, and drives the compare bit lines of second CAM bank 22 with operand B. Third register file 54 responds to index 3, and drives the compare bit lines of third CAM bank 32 with operand C. Each of the three sequences can then include write-backs from the compare bit lines to the matching rows to over-write the matching pixels. The compare registers could be re-loaded with the over-writing data after the compares are complete, or another register with the over-write data that can drive the compare bit lines could be used. Two compare registers can be used to complete one compare and one write.

FIG. 6B shows the second pass of the loop. After the swap instructions are performed at the end of the first pass of the loop of FIG. 5A, the indexes that the register files respond to have been rotated backwards.

First register file 50 now responds to index 3, and drives the compare bit lines of first CAM bank 12 with operand C. Second register file 52 responds to index 1, and drives the compare bit lines of second CAM bank 22 with operand A. Third register 54 responds to index 2, and drives the compare bit lines of third CAM bank 32 with operand B. Each of the three sequences can then include write-backs from the compare bit lines to the matching rows to over-write the matching pixels.

FIG. 6C shows the third pass of the loop. After the swap instructions are again performed at the end of the second pass of the loop of FIG. 5A, the indexes that the register files respond to have been rotated backwards.

First register file 50 now responds to index 2, and drives the compare bit lines of first CAM bank 12 with operand B. Second register file 52 responds to index 3, and drives the compare bit lines of second CAM bank 22 with operand C. Third register 54 responds to index 1, and drives the compare bit lines of third CAM bank 32 with operand A. Each of the three sequences can again include write-backs from the compare bit lines to the matching rows to over-write the matching pixels.

After all three passes of the loop, the data set in first CAM bank 12 has been compared to op_A, op_C, and op_B in the first, second, and third passes of the loop. Matching pixels have been over-written or otherwise operated upon. The second data set in second CAM bank 22 has been compared to op_B, op_A, and op_C, and the third data set in third CAM bank 22 has been compared to op_C, op_B, and op_A in the first, second, and third passes of the loop. The data sets have not been moved, yet all compare data has been used. Improved coding efficiency and performance can result especially when large data sets are used.

Figure 7:
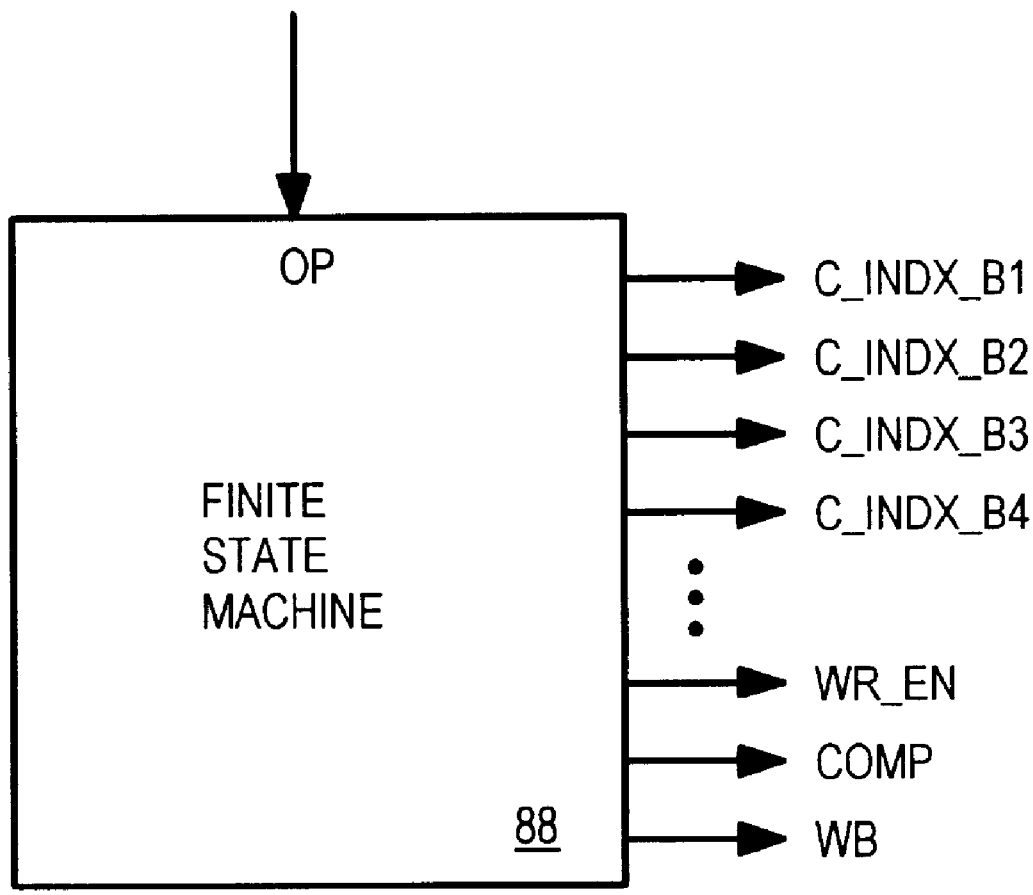
FIG. 7 shows a finite state machine that can implement the index remapping that allows for CAM bank-swapping.

FIG. 7 shows a finite state machine that can implement the index remapping that allows for CAM bank-swapping.

Finite state machine 88 receives inputs including an operating instruction input. The instructions may include an opcode that identifies the instruction as a swap, register-load, read-write, write-back, or compare operation. The read or write index identifying which compare or read-write register to access may also be included as a field in the instruction.

State machine 88 sequences through various states to perform the requested instruction. Control signals to the CAM can include various write enables, mux controls, driver enables, latch signals, address signals, and gated clock signals. For example, one signal can cause the masker to drive the compare bit lines and another signal can cause the result register to latch the match lines.

The index can be decoded and output by state machine 88 on several lines to the register files of various CAM banks. These index control lines could pulse high to load a data or mask register from the compare-input bus. Only one of the N index lines to each register file pulses high so that only one of the registers for a bank is loaded at a time. Other index outputs from state machine 88 can mux the proper compare register value to the masker and compare bit lines. State machine 88 can include compare logic to compare an index from an instruction to current indexes for CAM banks and programmable registers.

Figure 8:
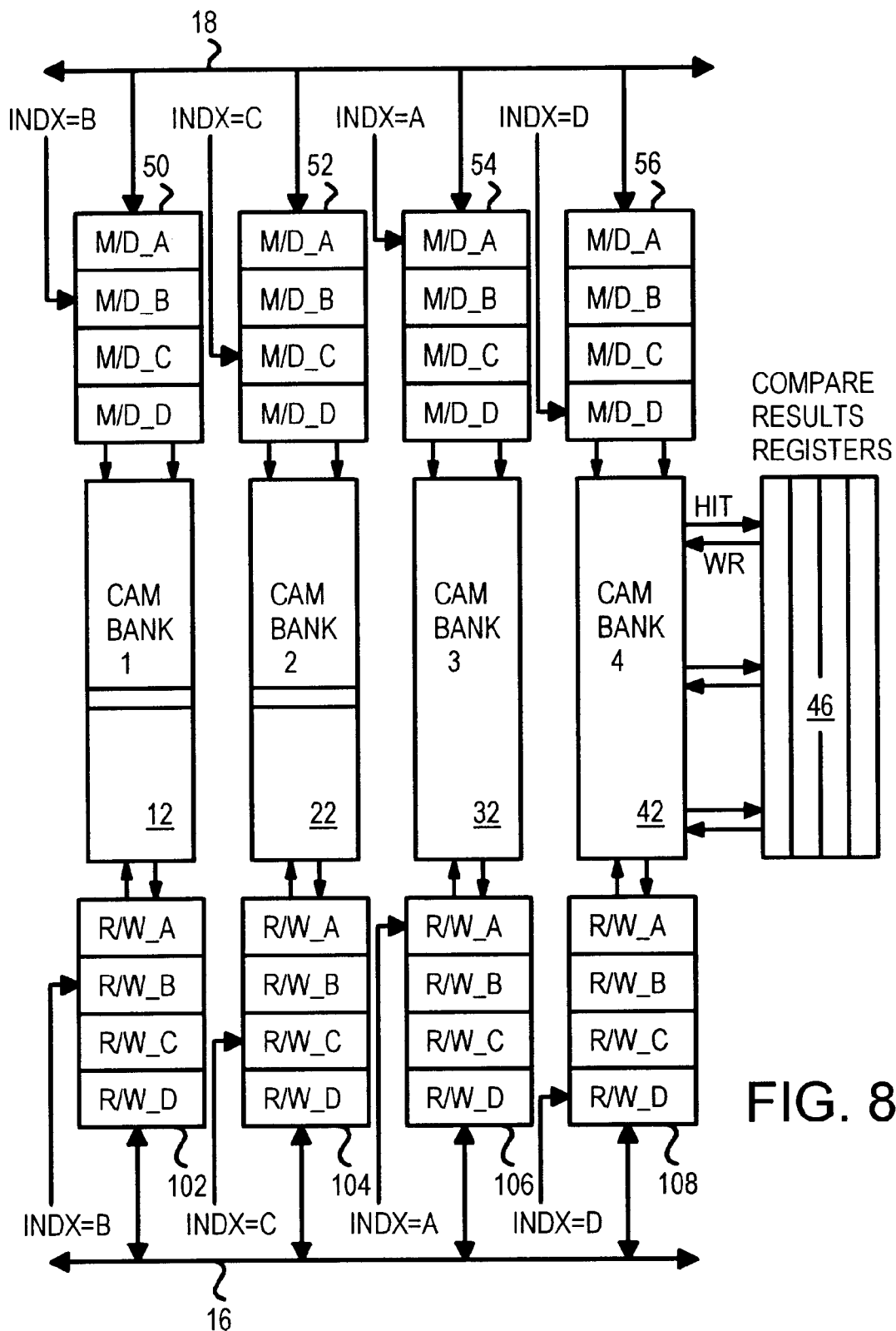
FIG. 8 is an alternate embodiment using register files for the read-write registers.

FIG. 8 is an alternate embodiment using register files for the read-write registers. Rather than use pass-through or single read-write registers at the bottom of each CAM bank 12, 22, 32, 42, read-write register files 102, 104, 106, 108 are used. Each contains shadow registers so that all read-write values can be stored. The index signals select one of the registers in register files 102, 104, 106, 108 for use. When a bank swap occurs, the indexes to read-write register files 102, 104, 106, 108 are also swapped as were the indexes to register files 50, 52, 54, 56 to the upper (compare) port. Other components are as described for FIG. 3.

Figure 9:
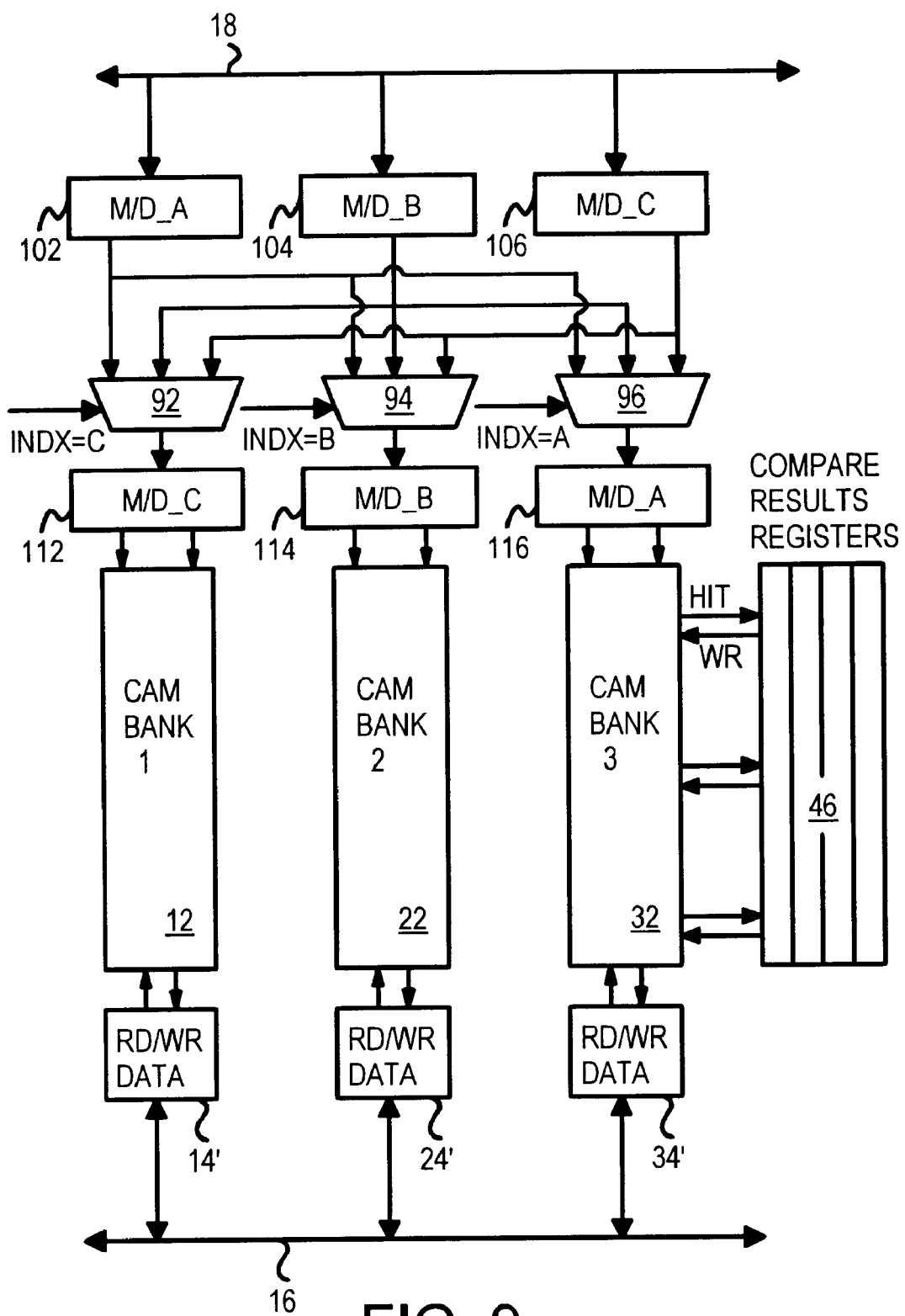
FIG. 9 is another embodiment using staging registers and a switch multiplexer.

FIG. 9 is another embodiment using staging registers and a switch multiplexer. Rather than use separate shadow registers for each bank, the mask data can be stored in one location and then moved to the desired bank(s) using a crossbar switch or multiplexers, or routing logic.

Compare and mask data from bus 18 can be written into one or more of staging registers 102, 104, 106. For example, when the mask data is nominally for first CAM bank 12, then staging register 102 is written with this compare mask, M/D_A. Compare data for second CAM bank 22 is written into staging register 104, while compare data for third CAM bank 32 is written to staging register 106. Of course, these registers could be re-mapped or organized in a variety of ways.

When no bank swapping instructions have been executed, mux 92 selects M/D_A from first staging register 102 and loads it into compare register 112, which drives the compare bit lines for first CAM bank 12. Likewise, mux 94 selects M/D_B from second staging register 104 and loads it into compare register 114, which drives the compare bit lines for second CAM bank 22. Mux 96 selects M/D_C from third staging register 104 and loads it into compare register 114, which drives the compare bit lines for third CAM bank 32.

When a swap instruction has been decoded and executed by the finite state machine, the finite state machine changes the control signals to muxes 92, 94, 96. For example, when the first and third CAM banks are swapped, first mux 92 is sent a select signal that corresponds to index C, while third mux 96 is sent a select signal corresponding to index A. Thus mux 92 selects M/D_C from third staging register 106 to be loaded into compare register 112, while mux 96 selects M/D_A from first staging register 102 to be loaded into compare register 116. Since the second bank was not swapped in this example, second CAM bank 22 continues to have its compare lines driven by M/D_B from compare register 112, which was loaded from second staging register 104 by mux 94.

Other control signals may be generated by the finite state machine for timing purposes, such as latch or clock signals to the staging and compare registers. Bank compare enable signals may be sent to each CAM bank to enable or disable compare operations. These compare operations can occur in parallel in all CAM banks at the same time, or can be disabled for one or more CAM banks. Some embodiments using shared match lines cannot perform such parallel compare operations.

Dual simultaneous direct-memory access (DMA) operations can be supported by using the read/write port at the bottom of each CAM bank. Read-write bus 16 can be expanded to two buses to allow one read and one write operation of two different banks at the same time. Two DMA engines can then be supported.

ALTERNATE EMBODIMENTS

Several other embodiments are contemplated by the inventors. For example different numbers of CAM banks can be used and additional registers can be added. Associative array architectures may be used for a wide variety of processing applications such as image processing, weather-data processing, topographic map processing, 3-dimensional modeling, chemical and biological process simulations, gene-map comparisons, etc. Such associative processing is most useful for operations on large data sets, but can be used for smaller sets of data. A rows could store exactly one data item such as a pixel, or two or more data items could be stored per row, such as having two pixels side-by-side. Larger data items could be spread across multiple rows. Each CAM bank can have a same number of rows and bits per row as other CAM banks, or banks can vary in size.

Mask bits may be encoded, or there may be one mask bit for each compare data bit. The mask bits can be combined with the data bits before storage in the register file. Additional information may be stored in the results register. Rather than use row decoders, ring pointers can be used to select rows for writing or reading from the bottom port. Re-mapping and decoding logic can be shared among several or all banks or separate instances of logic can be used. A single re-mapper can have multiple outputs for each CAM bank's register file. The index may be separate for CAM bank, or may be combined together as a single value that contains index information for two or more, or even all CAM banks. The index can be encoded, inverted, mathematically manipulated, and changed in a wide variety of ways and combined with other signals such as enables and clock signals.

The finite state machine can keep track of current register and CAM bank mappings using a mapping table. Multiple mapping tables could be maintained to support multi-tasking and quick process switching. Virtual register re-mapping can be supported.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. §1.72(b). Any advantages and benefits described may not apply to all embodiments of the invention. When the word "means" is recited in a claim element, Applicant intends for the claim element to fall under 35 USC §112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein performing the function and their structural equivalents, but also equivalent structures. For example, although a nail and a screw have different structures, they are equivalent structures since they both perform the function of fastening. Claims that do not use the word means are not intended to fall under 35 USC §112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A multi-bank content-addressable memory (CAM) comprising:

a plurality of CAM banks, each CAM bank having a plurality of rows of CAM cells that each store data and compare data to data on compare bit lines to generate row-match signals when data stored in a row matches data on the compare bit lines;

a plurality of register files for the plurality of CAM banks, each register file coupled to the compare bit lines for one of the plurality of CAM banks, each register file having a plurality of compare registers for storing compare data for driving the compare bit lines;

a first compare register and a second compare register in each of the plurality of register files;

wherein each register file receives an index that identifies one of the plurality of compare registers to drive the compare bit lines of a CAM bank coupled to the register file by the compare bit lines;

wherein the plurality of register files includes a first register file that receives a first index and a second register file that receives a second index, the first register file being coupled by first compare bit lines to a first CAM bank in the plurality of CAM banks, and the second register file being coupled by second compare bit lines to a-second CAM bank in the plurality of CAM banks; and bank-swap means for exchanging the first index to the first register file with the second index to the second register file;

wherein before execution of a bank-swap operation by the bank-swap means the first index identifies the first compare register of the first register file to drive the first compare bit lines while the second index identifies the second compare register of the second register file to drive the second compare bit lines;

wherein after execution of a bank-swap operation by the bank-swap means the first index identifies the second compare register of the first register file to drive the first compare bit lines while the second index identifies the first compare register of the second register file to drive the second compare bit lines, whereby indexes to CAM bank compare registers are exchanged to swap CAM banks.

2. The multi-bank CAM of claim 1 wherein each of the plurality of registers files stores a same set of compare data in the compare registers;

wherein compare data is mirrored to all register files for all CAM banks, whereby each CAM bank stores compare data for all CAM banks.

3. The multi-bank CAM of claim 2 wherein each register file has a different value of the index, wherein different register files for different CAM banks drive data from different compare registers to the compare bit lines, whereby each CAM bank is driven by different compare data, although each CAM bank stores compare data for all CAM banks.

4. The multi-bank CAM of claim 3 wherein the plurality of CAM banks comprises N CAM banks, wherein N is a whole number greater than one;

wherein the plurality of register files comprises N register files, wherein each of the N register files comprises N compare registers that can store N different compare values, whereby a copy of the N different compare values are stored in each of the N register files.

5. The multi-bank CAM of claim 4 further comprising:

compare load means, coupled to the plurality of register files, for writing a compare value to a selected compare register in each of the plurality of register files;

wherein the selected compare register is selected by a same index value sent to all of the plurality of register files, whereby compare values are loaded to all register files in a parallel load.

6. The multi-bank CAM of claim 5 wherein the bank-swap means comprises a finite state machine, decoding logic, an index re-map lookup table, or a re-mapper.

7. The multi-bank CAM of claim 3 wherein each CAM bank further comprises:

read-write bit lines that connect to all rows of the CAM cells, the CAM cells in a row being over-written by data on the read-write bit lines when the row is selected by a row select line;

a read-write port coupled between the read-write bit lines and a read-write bus that connects to read-write ports of all CAM banks, whereby CAM cells are written through the read-write ports.

8. The multi-bank CAM of claim 3 further comprising:

a results register, coupled to the row-match signals from the CAM cells, for storing compare results for all rows of all CAM banks.

9. The multi-bank CAM of claim 8 further comprising:

write-back signals output from the results register to rows of CAM cells, for enabling write-back of compare data on the compare bit lines to the CAM cells in a plurality of rows that are enabled by activated write-back signals.

10. A fast bank-swapping associative-processing array comprising:

a plurality of content-addressable memory (CAM) cells arrayed into banks having rows and multi-bit columns, each CAM cell storing a bit of data, the bit of data being readable and writeable using read-write bit lines connected to a single-bit column of CAM cells, the bit of data being compared to compare data on compare bit lines connected to the single-bit column of CAM cells, wherein compare results for a row of CAM cells is output as a match line;

a first bank of the CAM cells for storing a first data set;

a second bank of the CAM cells for storing a second data set;

a third bank of the CAM cells for storing a third data set;

a first set of compare registers that include a first bank-one shadow register, a first bank-two shadow register, and a first bank-three shadow register;

a first selector, initially receiving a first index that identifies one of the first set of compare registers, for driving compare data from a selected one of the first set of compare registers onto the compare bit lines in the first bank;

a second set of compare registers that include a second bank-one shadow register, a second bank-two shadow register, and a second bank-three shadow register;

a second selector, initially receiving a second index that identifies one of the second set of compare registers, for driving compare data from a selected one of the second set of compare registers onto the compare bit lines in the second bank;

a third set of compare registers that include a third bank-one shadow register, a third bank-two shadow register, and a third bank-three shadow register;

a third selector, initially receiving a third index that identifies one of the third set of compare registers, for driving compare data from a selected one of the third set of compare registers onto the compare bit lines in the third bank; and a re-mapper, responsive to a bank-swap operation, that
(1) drives the first index to the second selector and drives the second index to the first selector after the bank-swap operation swaps the first bank and the second bank;
(2) drives the first index to the third selector and drives the third index to the first selector after the bank-swap operation swaps the first bank and the third bank;
(3) drives the third index to the second selector and drives the second index to the third selector after the bank-swap operation swaps the third bank and the second bank, whereby the bank-swap operation swaps compare registers selected to drive compare bit lines in a pair of banks of CAM cells.

11. The fast bank-swapping associative-processing array of claim 10 wherein each shadow register comprises a mask register and a data register, further comprising:

a first masker, coupled between the first set of compare registers and the compare bit lines in the first bank, for combining mask bits in the mask register with data bits in the shadow register to generate the compare data;

a second masker, coupled between the second set of compare registers and the compare bit lines in the second bank, for combining mask bits in the mask register with data bits in the shadow register to generate the compare data; and a third masker, coupled between the third set of compare registers and the compare bit lines in the third bank, for combining mask bits in the mask register with data bits in the shadow register to generate the compare data, whereby mask bits are used to generate the compare data.

12. The fast bank-swapping associative-processing array of claim 10 wherein the first index initially selects the first bank-one shadow register;

the second index initially selects the second bank-two shadow register;

the third index initially selects the third bank-three shadow register, whereby different shadow registers are initially selected to drive the compare bit lines in different banks of the CAM cells.

13. The fast bank-swapping associative-processing array of claim 12 further comprising:

a compare-input bus coupled to the first, second, and third set of compare registers;

wherein a bank-one load of compare data writes compare data from the compare-input bus to the first bank-one shadow register, the second bank-one shadow register, and the third bank-one shadow register in parallel;

wherein a bank-two load of compare data writes compare data from the compare-input bus to the first bank-two shadow register, the second bank-two shadow register, and the third bank-two shadow register in parallel;

wherein a bank-three load of compare data writes compare data from the compare-input bus to the first bank-three shadow register, the second bank-three shadow register, and the third bank-three shadow register in parallel, whereby compare data is loaded in parallel to all three sets of shadow registers.

14. The fast bank-swapping associative-processing array of claim 10 further comprising:

a fourth bank of the CAM cells for storing a fourth data set;

a fourth set of compare registers that include a fourth bank-one shadow register, a fourth bank-two shadow register, and a fourth bank-three shadow register; and a fourth selector, initially receiving a fourth index that identifies one of the fourth set of compare registers, for driving compare data from a selected one of the fourth set of compare registers onto the compare bit lines in the fourth bank, whereby the CAM cells are arranged into at least four banks.

15. The fast bank-swapping associative-processing array of claim 10 wherein the first data set, the second data set, and the third data set each represent pixel data.

16. The fast bank-swapping associative-processing array of claim 10 further comprising:

a read-write bus;

a first read-write port coupled between the read-write bus and the read-write bit lines in the first bank;

a second read-write port coupled between the read-write bus and the read-write bit lines in the second bank;

a third read-write port coupled between the read-write bus and the read-write bit lines in the third bank, whereby data is written into a row of the CAM cells through a read-write port.

17. The fast bank-swapping associative-processing array of claim 16 wherein the first read-write port comprises a first read-write register for storing data from the read-write bus for writing to a row in the first bank;

wherein the second read-write port comprises a second read-write register for storing data from the read-write bus for writing to a row in the second bank;

wherein the third read-write port comprises a third read-write register for storing data from the read-write bus for writing to a row in the third bank.

18. The fast bank-swapping associative-processing array of claim 17 wherein the first read-write register comprises a plurality of registers that includes a selected register that is selected by the first index;

wherein the second read-write register comprises a plurality of registers that include a selected register that is selected by the second index;

wherein the third read-write register comprises a plurality of registers that include a selected register that is selected by the third index.

19. A content-addressable memory (CAM) processor comprising:

a first CAM bank, a second CAM bank, and a third CAM bank, each bank having content-addressable memory cells arranged into rows and columns, wherein columns are spanned by compare lines carrying compare data for comparison to data stored in the content-addressable memory cells, and each row outputs a match line that is activated when compare data on the compare lines matches data stored in the content-addressable memory cells in a row;

a compare-data input bus;

input register file means, coupled to write compare data from the compare-data bus to one of a plurality of input registers, for storing a plurality of compare data;

first compare register means, coupled to receive compare data from one of the plurality of input registers, for driving compare data from a first selected one of the plurality of input registers to the compare lines in the first CAM bank;

first re-map means, coupled between the input register file means and the first compare register means, for causing the first compare register means to be loaded from a different one of the plurality of input registers after execution of a bank-swap operation than before execution of the bank-swap operation;

second compare register means, coupled to receive compare data from one of the plurality of input registers, for driving compare data from a second selected one of the plurality of input registers to the compare lines in the second CAM bank;

second re-map means, coupled between the input register file means and the second compare register means, for causing the second compare register means to be loaded from a different one of the plurality of input registers after execution of a bank-swap operation than before execution of the bank-swap operation;

third compare register means, coupled to receive compare data from one of the plurality of input registers, for driving compare data from a third selected one of the plurality of input registers to the compare lines in the third CAM bank;

third re-map means, coupled between the input register file means and the third compare register means, for causing the third compare register means to be loaded from a different one of the plurality of input registers after execution of a bank-swap operation than before execution of the bank-swap operation;

whereby execution of the bank-swap operation alters selection of input registers but does not move data in the content-addressable memory cells.

20. The CAM processor of claim 19 further comprising:

result register means, coupled to the match lines, for storing compare results, wherein the first, second, and third re-map means comprises a switch or multiplexer.

* * * * *